(12) United States Patent
Liang

(10) Patent No.: US 7,234,091 B2
(45) Date of Patent: *Jun. 19, 2007

(54) METHOD AND APPARATUS FOR TRANSFERRING HIDDEN SIGNALS IN A BOUNDARY SCAN TEST INTERFACE

(75) Inventor: Bor-Sung Liang, Kaohsiung (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 291 days.

This patent is subject to a terminal disclaimer.

(21) Appl. No.: 11/032,008

(22) Filed: Jan. 11, 2005

(65) Prior Publication Data

US 2005/0172191 A1 Aug. 4, 2005

(30) Foreign Application Priority Data

Jan. 16, 2004 (TW) ............... 93101268 A

(51) Int. Cl.
*G01R 31/28* (2006.01)
(52) U.S. Cl. .................................... 714/727
(58) Field of Classification Search ............ None
See application file for complete search history.

(56) References Cited

U.S. PATENT DOCUMENTS 5,768,196 A * 6/1998 Bloker et al. ............ 365/200
5,898,704 A * 4/1999 Kawano ................... 714/727
6,073,254 A 6/2000 Whetsel
6,378,090 B1 4/2002 Bhattacharya
7,047,467 B1 * 5/2006 Khu et al. ................ 714/727

FOREIGN PATENT DOCUMENTS

EP 1089083 4/2001

* cited by examiner

*Primary Examiner*—Christine T. Tu
(74) *Attorney, Agent, or Firm*—Bacon & Thomas, PLLC

(57) ABSTRACT

An apparatus and method for transferring hidden signals in a boundary scan test interface is disclosed, which defines an invalid state transition loop in a boundary scan test interface and initially monitors an input of state transition diagram of the boundary scan test interface so that an output of a first data is generated when a first predetermined input stream conforming to the invalid state transition loop is detected, and then an output of a second data is generated when a second predetermined input stream is detected, wherein the second predetermined input stream is different from the first one and also conforms to the invalid state transition loop.

18 Claims, 6 Drawing Sheets

METHOD AND APPARATUS FOR TRANSFERRING HIDDEN SIGNALS IN A BOUNDARY SCAN TEST INTERFACE

BACKGROUND OF THE INVENTION

1. Field of the Invention

The present invention relates to a technical field of boundary scan test interface and, more particularly, to an apparatus and method for transferring hidden signals in a boundary scan test interface.

2. Description of Related Art

Since chip packages and multi-level printed circuit boards (PCBs) have become complicated more and more, the conventional in-circuit test using a bed-of-nail is not satisfactory as it is difficult to accurately contact the nodes on a PCB. In addition, due to the advance of surface mount technology (SMT), most ICs are mounted directly on the surface of a circuit board, which causes a problem that internal signals of the ICs cannot be tested directly. To overcome this, boundary scan technique has been developed. For example, the Joint Test Action Group (JTAG) boundary scan, formally known as IEEE-Std-1149.1, and IEEE 1149.4 Digital Test Access Port interface, to define available boundary scan test interfaces for IC testing, which applies serial scan chain for testing the internal modules of an IC. FIG. 1 shows a block diagram of a typical JTAG interface. In FIG. 1, the JTAG interface uses five signal pins (TDI, TDO, TMS, TCK and nTRST) in scan chain data operation, i.e., TDI pin as a serial data input, TDO pin as a serial data output, TMS pin as a mode selection input, TCK pin as a clock input and nTRST pin as a system reset. As shown in FIG. 1, the JTAG interface includes a test access port (TAP) controller 11, a test data register 12, an instruction register 13 and a decoder 14.

The test data register 12 includes a scan chain register 121 as a scan chain to store serial data received by the TDI pin, an ID code register 122 storing special numbers to output, a bypass register 123 to directly forward the serial data from the TDI pin to the TDO pin for output.

The instruction register 13 stores a serial instruction received by the TDI pin. The decoder 14 decodes the serial instruction to thus control operations of the TAP controller 11.

The TAP controller 11 performs state transition based on the TMS pin's input and operates with the data of the register 12 and the outcome of the decoder 14. FIG. 2 is a state transition diagram of the TAP controller 11, where state transition occurs in sampling TMS signals at rising edges of a TCK signal output. As shown in FIG. 2, initially, the TAP controller 11 is at Test-Logic Reset state. Next, the controller 11 can enter states of idle process 21, data register process 22 and instruction register process 23. As TMS=1, the Test-Logic Reset state is unchanged, and when TMS=0, the state is transited to Run-Test/Idle state of the idle process 21. Next, the Run-Test/Idle state is unchanged as TMS=0, and transited to Select-DR-Scan state of the data register process 22 as TMS=1. In the Select-DR-Scan state, as TMS=0, the state is transited to Capture-DR state for processing of the register 12, and conversely, as TMS=1, the state is transited to Select-IR-Scan state of the instruction register process 23. In the Select-IR-Scan state, as TMS=0, the state is transited to Capture-IR state for processing of the register 13, and conversely, as TMS=1, the state is transited to the initial Test-Logic Reset state.

The aforementioned JTAG can transfer control signals or access registers through TDI and TDO pins for data read and write. However, data read and write through TDI and TDO pins are in sequential and can easily be detected. Thus, such secret control signals cannot be protected. However, current processor development needs to protect equipment for development from steal by others. Therefore, it is desirable to provide an improved apparatus and method to mitigate and/or obviate the aforementioned problems.

SUMMARY OF THE INVENTION

An object of the invention is to provide an apparatus and method for transferring hidden signals in a boundary scan test interface, which can input signals without passing through a standard input/output pin, thereby achieving secure transmission for secret control signals in boundary scan test interface.

Another object of the invention is to provide an apparatus and method for transferring hidden signals in a boundary scan test interface, which can obtain secret control signals as compatible with the boundary scan test interface and does not impact completely on state and data paths of the boundary scan test interface.

According to a feature of the invention, an apparatus for transferring hidden signals in a boundary scan test interface is provided. The boundary scan test interface operates with a predetermined state transition diagram to perform state transition based on an input, wherein the state transition performed includes at least one invalid state transition loop. The apparatus includes: a state detector for monitoring the input so as to output a first data when a first predetermined input stream is detected, and then output a second data when a second predetermined input stream is detected, wherein the first and the second predetermined input streams are different and both conform to the invalid state transition loop.

According to another feature of the invention, a method for transferring hidden signals in a boundary scan test interface is provided. The boundary scan test interface operates with a predetermined state transition diagram to perform state transition based on an input, wherein the state transition performed includes at least one invalid state transition loop. The method includes the steps of: (A) monitoring the input so as to output a first data when a first predetermined input stream is detected, wherein the first predetermined input stream conforms to the invalid state transition loop; and (B) monitoring the input so as to output a second data when a second predetermined input stream is detected, wherein the second predetermined input stream is different from the first one and also conforms to the invalid state transition loop.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
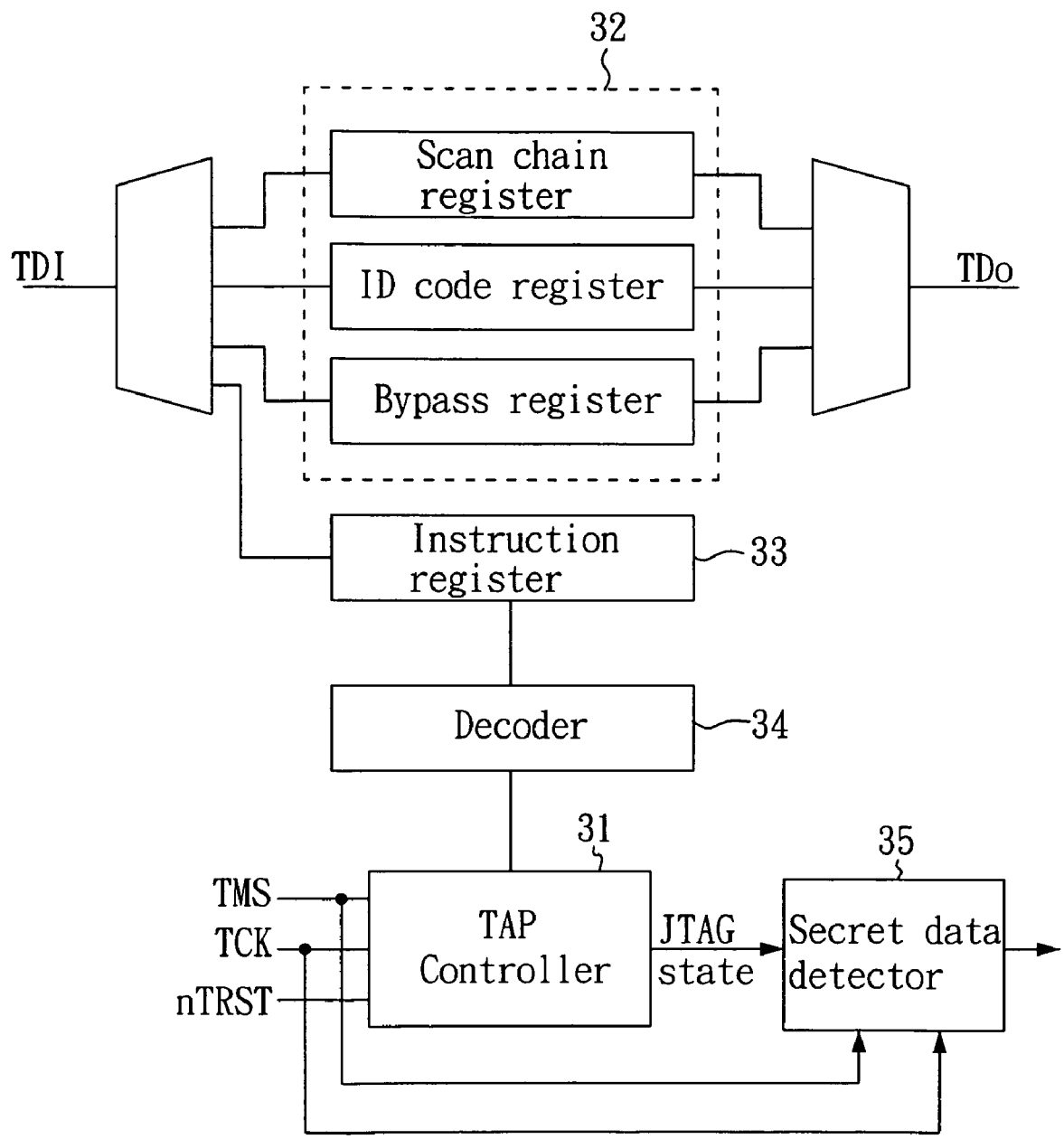
FIG. 3 is a block diagram of an apparatus for transferring hidden signals in a boundary scan test interface according to the invention.

FIG. 3 is a block diagram of an apparatus for transferring hidden signals in a boundary scan test interface according the invention. In FIG. 3, the apparatus includes a TAP controller 31, a test data register 32, an instruction register 33, a decoder 34 and a secret data detector 35. The boundary scan test interface can be JTAG, IEEE 1149.1, IEEE 1149.4 or the like. In this embodiment, the boundary scan test interface applies a JTAG interface for exemplary description. Accordingly, the TAP controller 31, the test data register 32, the instruction register 33 and the decoder 34 are operated with JTAG standard, which applies pins of serial data input (TDI), serial data output (TDO), mode selection input (TMS), clock input (TCK) and system reset (nTRST) to operate scan chain data. Further, the secret data detector 35 can have secret signal input based on TMS signal.

Figure 1:
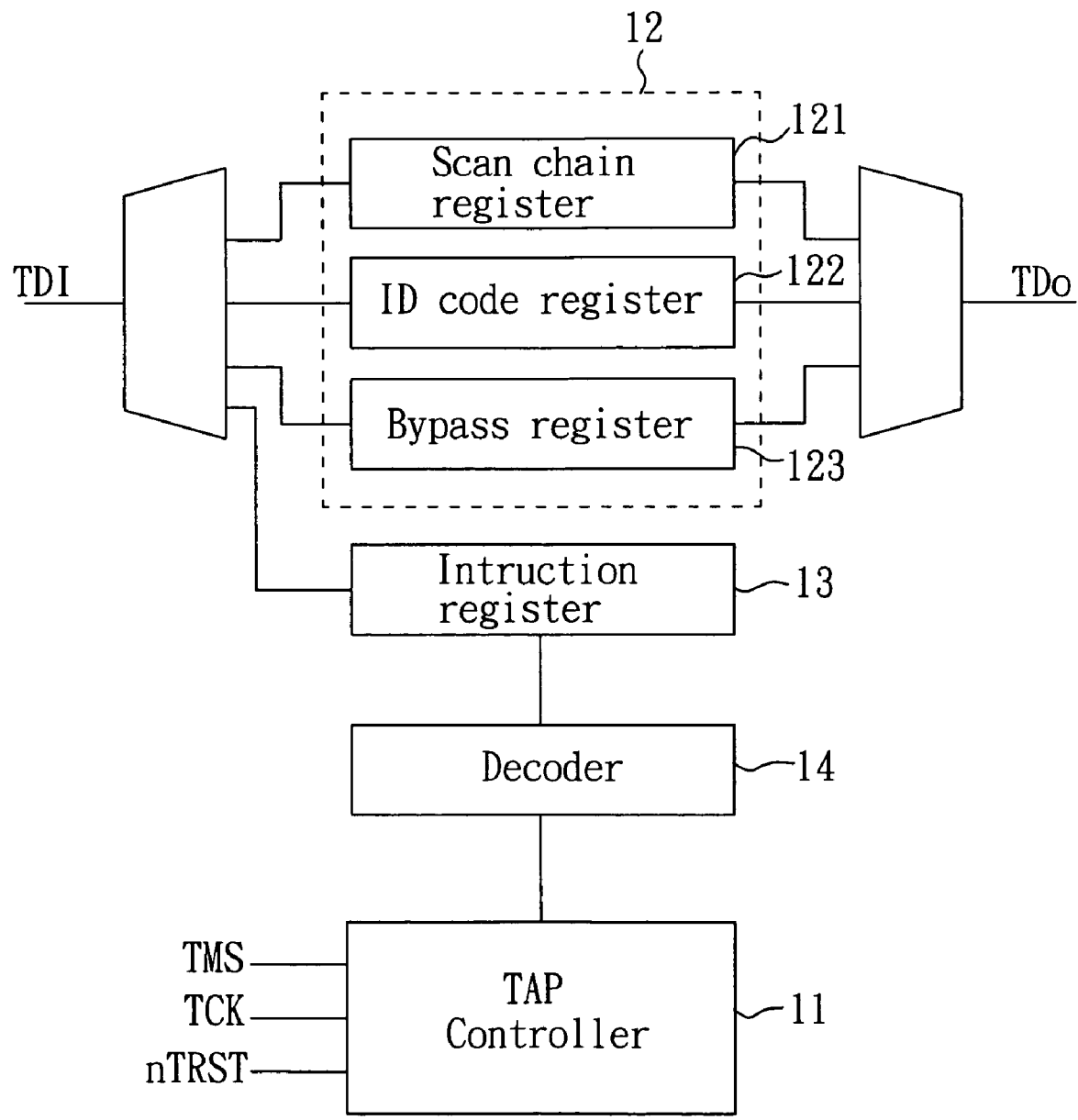
FIG. 1 is a block diagram of a typical JTAG interface.
Figure 2:
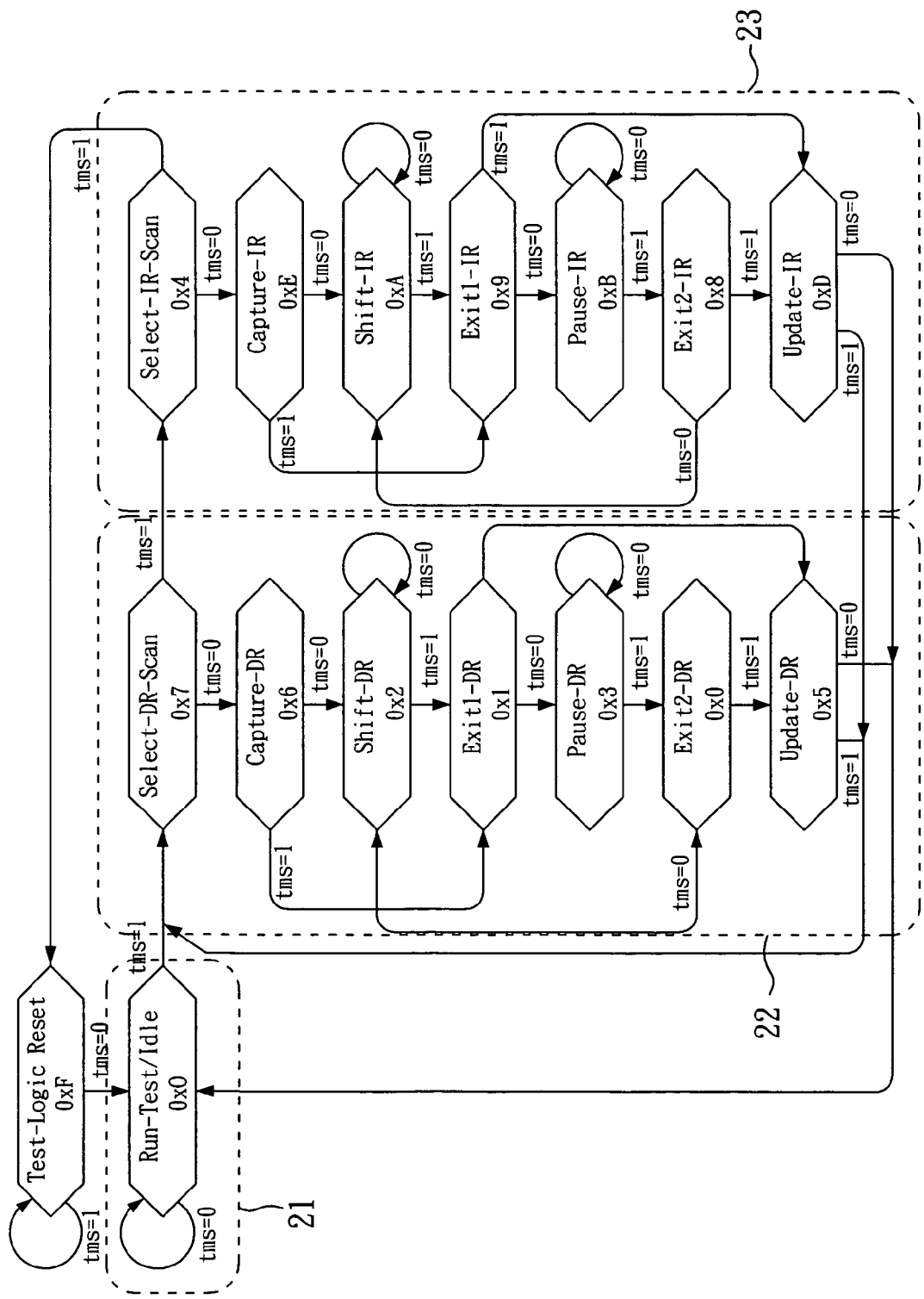
FIG. 2 is a state transition diagram of a TAP controller of FIG. 1.

Referring again to FIG. 2, the state transition diagram defined by the JTAG standard is initially at the Test-Logic Reset state. To make the JTAG interface inactive, an input of the TMS pin is at logic 1's (i.e., continuously inputting a sequence of '1') to stay at the Test-Logic Reset state. When desiring to activate the JTAG interface, the input of the TMS pin is changed to logic '0' for state transition. However, in order to avoid a '0' from accidentally occurring in a '1' sequence to thus activate the JTAG interface in mistake, state transition returns back to the initial Test-Logic Reset state through the Select-DR-Scan and Select-IR-Scan state if the input of the TMS pin remains at '1' after the Run-Test/Idle state is entered by inputting '0' to the TMS pin. Namely, an invalid state transition loop is substantially performed without entering any state that performs actual operation, thereby avoiding erroneous operation.

Figure 4:
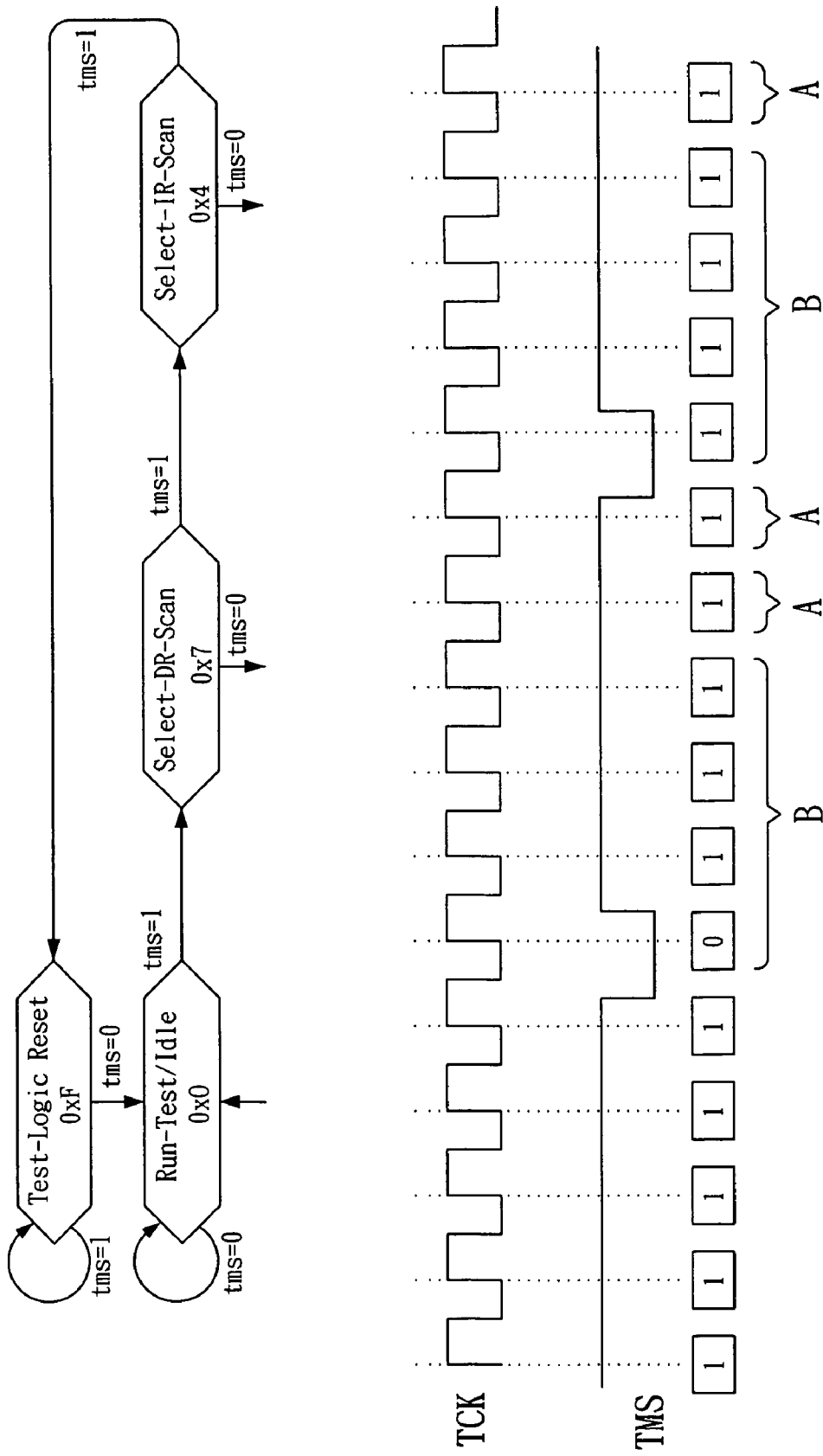
FIG. 4 is a flowchart of an invalid state transition loop in a state transition diagram of a TAP controller according to the invention.

FIG. 4 further shows the aforementioned invalid state transition loop. A TMS input stream that conforms to the invalid state transition loop will not cause any actual operation in the JTAG interface. Therefore, the invention defines at least two TMS input streams that conform to the invalid state transition loop, to represent two different input data A and B respectively. In this embodiment, A is '0' in binary and B is '1' in binary. As shown in FIG. 4, it is preferred to define a TMS input stream of '0111' as the input data B (=1) and the subsequent TMS input stream of '1' as the input data A (=0). In addition, since the Run-Testdata/Idle state is not changed as inputting '0', it is applicable to define a TMS input stream of '0 $\overline{0}$ 1 1 1' as the input data A or B, where $\overline{0}$ represents at least one '0'.

Figure 5:
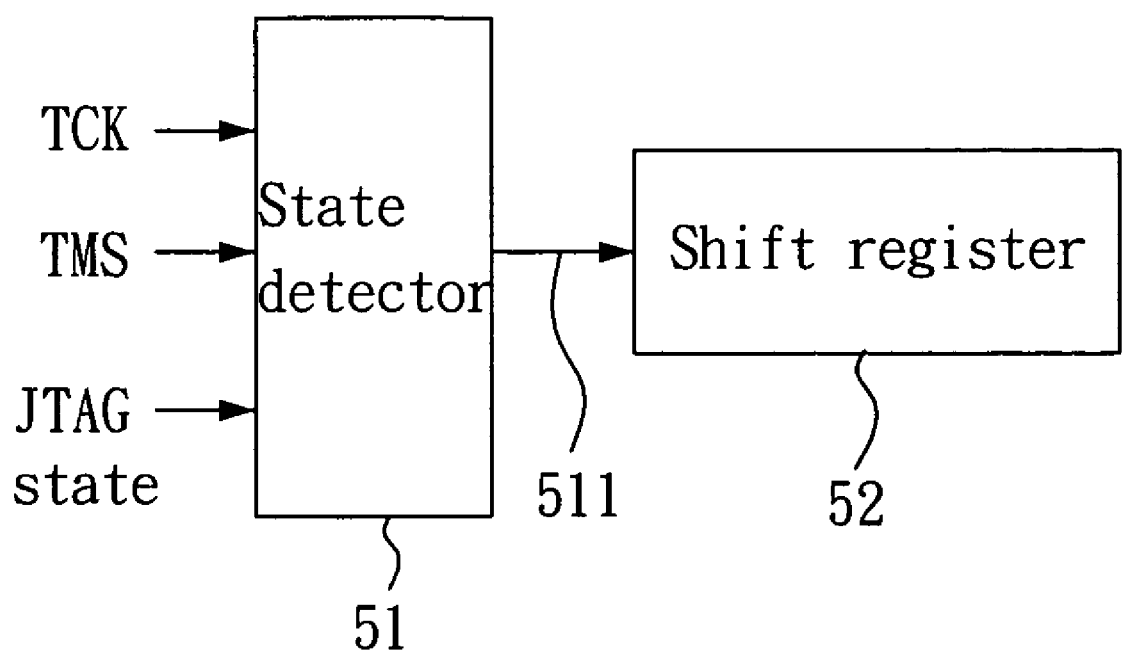
FIG. 5 is a block diagram of a secret data detector of FIG. 3 according to the invention.
Figure 6:
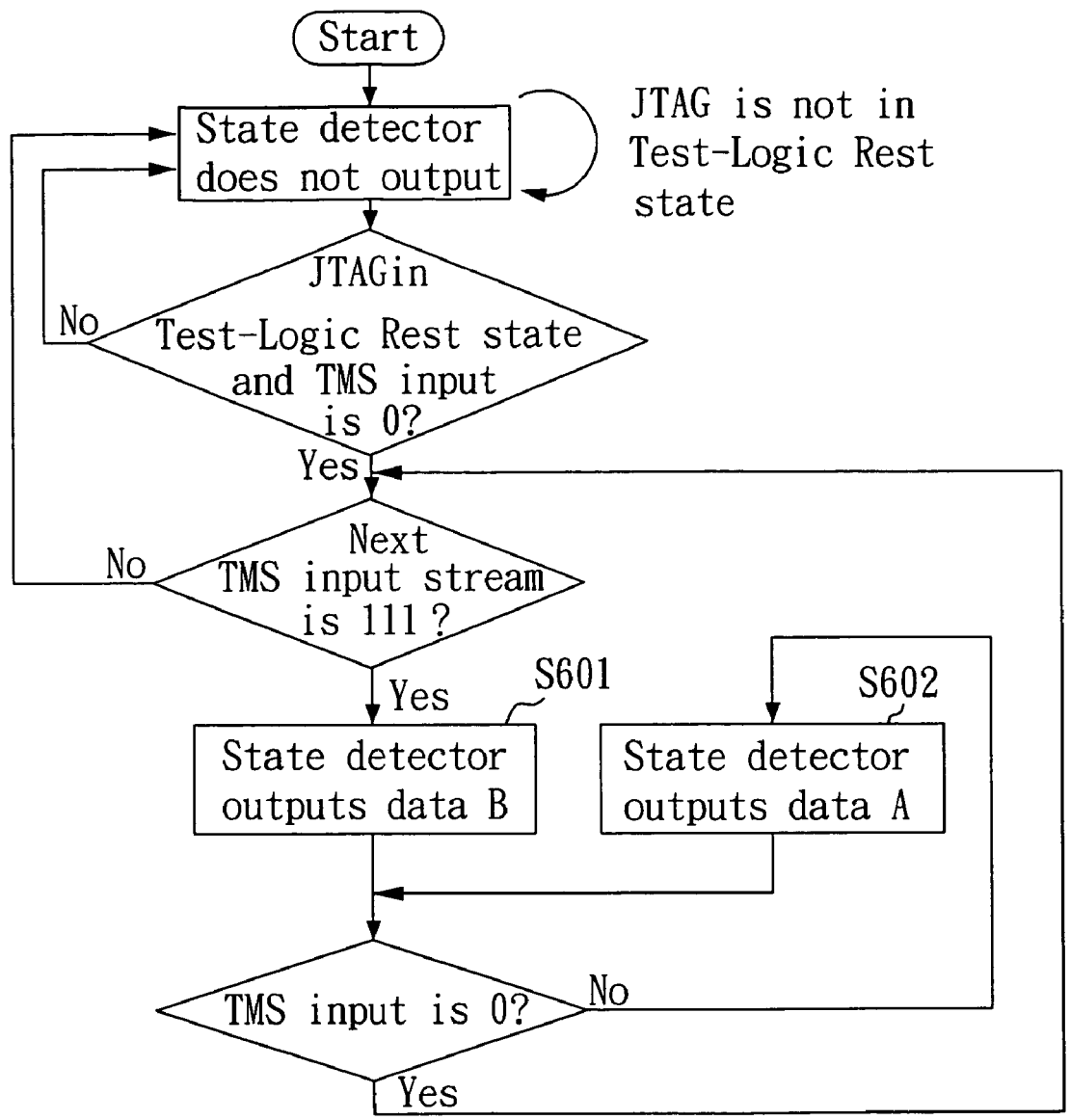
FIG. 6 is a flowchart of an operation of a state detector of FIG. 3 according to the invention.
Figure 6:
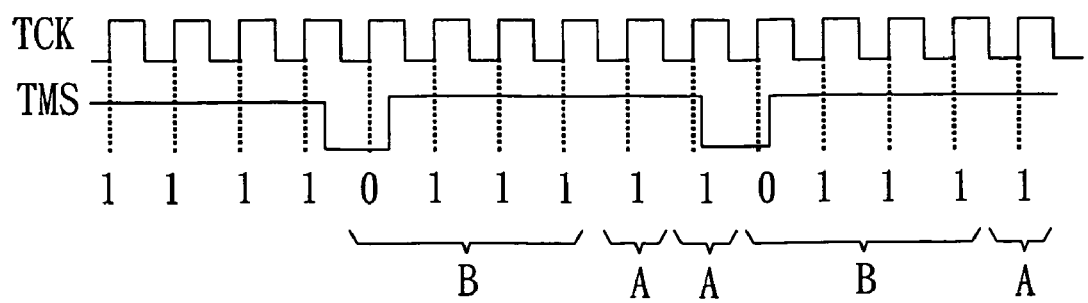

FIG. 5 shows a block diagram of the secret data detector 35 of FIG. 3. In FIG. 5, the secret data detector 35 includes a state detector 51 and a shifter register 52. The operation of the state detector 51 is shown in FIG. 6. As shown in FIG. 6, upon TCK input, TMS input, and JTAG state generated by the TAP controller 31, when the TAP controller 31 is determined as the Test-Logic Reset state, monitoring TMS input is started. When a TMS input stream of '0111' is detected, the data output 511 generates a data B (=1) for output (step S601). Next, when a TMS input stream of '1' is detected, the data output 511 generates a data A (=0) for output (step S602). Data combination for output is stored in the shifter register 52 as the data output 511 is outputting data. Therefore, desired data combination for input can be generated by the data output 511 of the state detector 51 by means of inputting appropriate combination of streams at the TMS pin. The data combination is stored temporarily in the shifter register 52, thereby achieving secure hidden signal transfer.

In view of the foregoing, it is known that the invention applies the invalid state transition loop in the state transition diagram of the boundary scan test interface to transfer hidden signals without inputting signals through the standard data input/output pins, thereby achieving protective transfer of secret control signals in the boundary scan test interface, which can be compatible completely with the boundary scan test interface and does not impact completely on states and data paths of the boundary scan test interface.

Although the present invention has been explained in relation to its preferred embodiment, it is to be understood that many other possible modifications and variations can be made without departing from the spirit and scope of the invention as hereinafter claimed.

What is claimed is:

1. An apparatus for transferring hidden signals in a boundary scan test interface, the boundary scan test interface operating with a predetermined state transition diagram to perform state transition based on an input, wherein the state transition performed has at least one invalid state transition loop, the apparatus comprising:
 a state detector, for monitoring the input so as to output a first data when a first predetermined input stream is detected, and then output a second data when a second predetermined input stream is detected, wherein the first and the second predetermined input streams are different and both conform to the invalid state transition loop.

2. The apparatus as claimed in claim 1, further comprising: a shifter register, for storing a combination of the first data and the second data outputted by the state detector.

3. The apparatus as claimed in claim 2, wherein the boundary scan test interface is a JTAG interface and the input is a TMS input.

4. The apparatus as claimed in claim 2, wherein the boundary scan test interface is an IEEE 1149.1 interface and the input is a TMS input.

5. The apparatus as claimed in claim 3, wherein the state transition diagram is initially at a Test-Logic Reset state, unchanged as the TMS input is '1', transited to a Run-Test/Idle state as the TMS input is '0', stayed at the Run-Test/Idle state as the TMS input is '0', and transited to the Test-Logic Reset state as the TMS input meets with three successive 1s, so as to form the at least one invalid state transition loop.

6. The apparatus as claimed in claim 5, wherein the first predetermined input stream is '0111' and the second predetermined input stream is '1'.

7. The apparatus as claimed in claim 6, wherein the first data is '1' and the second data is '0'.

8. The apparatus as claimed in claim 5, wherein the first predetermined input stream is '0 $\overline{0}$ 1 1 1' and the second predetermined input stream is '1', where $\overline{0}$ represents at least one '0'.

9. The apparatus as claimed in claim 8, wherein the first data is '1' and the second data is '0'.

10. The apparatus as claimed in claim 2, wherein the boundary scan test interface is an IEEE 1149.4 Digital Test Access Port interface and the input is a TMS input.

11. A method for transferring hidden signals in a boundary scan test interface, the boundary scan test interface operating with a predetermined state transition diagram to perform state transition based on an input, wherein the state transition performed has at least one invalid state transition loop, the method comprising the steps of:

(A) monitoring the input so as to output a first data when a first predetermined input stream is detected, wherein the first predetermined input stream conforms to the invalid state transition loop; and (B) monitoring the input so as to output a second data when a second predetermined input stream is detected, wherein the second predetermined input stream is different from the first one and also conforms to the invalid state transition loop.

12. The method as claimed in claim 11, further comprising the step of:

(C) storing the first data and the output of the second data in combination.

13. The method as claimed in claim 12, wherein the boundary scan test interface uses a JTAG interface and the input is a TMS input.

14. The method as claimed in claim 13, wherein the state transition diagram is initially at a Test-Logic Reset state, unchanged as the TMS input is '1', transited to a Run-Test/Idle state as the TMS input is '0', stayed at the Run-Test/Idle state as the TMS input is '0', and transited to the Test-Logic Reset state as the TMS input meets with three successive 1s, so as to form the at least one invalid state transition loop.

15. The method as claimed in claim 14, wherein in step (A), the first predetermined input stream is '0111' while the first data is '1'; in step (B), the second predetermined input stream in step (B) is '1' while the second data is '0'.

16. The method as claimed in claim 14, wherein in step (A), the first predetermined input stream is '0 $\bar{0}$ 1 1 1' while the first data is '1', where $\bar{0}$ represents at least one '0'; in step (B), the second predetermined input stream is '1' while the second data is '0'.

17. The method as claimed in claim 12, wherein the boundary scan test interface uses an IEEE 1149.1 interface and the input is a TMS input.

18. The method as claimed in claim 12, wherein the boundary scan test interface uses an IEEE 1149.4 Digital Test Access Port interface and the input is a TMS input.

* * * * *